United States Patent [19]

Tokumo

[11] Patent Number: 4,496,860
[45] Date of Patent: Jan. 29, 1985

[54] VOLTAGE-CONTROLLED ATTENUATOR

[75] Inventor: Akio Tokumo, Saitama, Japan

[73] Assignee: Pioneer Electronic Corporation, Tokyo, Japan

[21] Appl. No.: 361,934

[22] Filed: Mar. 25, 1982

[30] Foreign Application Priority Data

Mar. 27, 1981 [JP] Japan .............................. 56-44167

[51] Int. Cl.³ .............................................. H03K 5/08
[52] U.S. Cl. .................................. 307/542; 307/555
[58] Field of Search .............. 307/540, 555, 542, 494, 307/552, 553; 330/252, 254, 284, 257; 328/54, 168, 169

[56] References Cited

U.S. PATENT DOCUMENTS

| 3,241,078 | 3/1966 | Jones | 307/494 |
|---|---|---|---|
| 3,681,614 | 8/1972 | Kroos | 330/252 |
| 3,689,752 | 9/1972 | Gilbert | 307/494 |
| 3,875,522 | 4/1975 | Hoefi | 330/284 |
| 4,019,118 | 4/1977 | Harwood | 330/252 |
| 4,197,505 | 4/1980 | Nishijima et al. | 307/567 |
| 4,327,333 | 4/1982 | Wilcox | 330/254 |
| 4,331,929 | 5/1982 | Yokoyama | 330/252 |
| 4,396,891 | 8/1983 | Johansson et al. | 330/254 |

FOREIGN PATENT DOCUMENTS 55-63112  5/1980  Japan .................................. 330/254

Primary Examiner—Stanley D. Miller
Assistant Examiner—Timothy P. Callahan
Attorney, Agent, or Firm—Sughrue, Mion, Zinn, Macpeak, and Seas

[57] ABSTRACT

A voltage-controlled attenuator achieves lower distortion and noise through a construction wherein collector currents of a driving differential amplifier are linearized by employing a current mirror configuration. The circuit design lends itself to IC fabrication by lowering current requirements.

4 Claims, 3 Drawing Figures

VOLTAGE-CONTROLLED ATTENUATOR

BACKGROUND OF THE INVENTION

This invention relates to a voltage-controlled attenuator which is made low in noise and distortion.

A conventional voltage-controlled attenuator is arranged as shown in FIG. 1.

More specifically, an input voltage $E_{IN}$ is converted into a current by a differential amplifier having transistors $Q_1$ and $Q_2$, and the current is used to drive the common emitters of a pair of differential amplifiers which include transistors $Q_3$ and $Q_4$, and $Q_5$ and $Q_6$, respectively. The base biases of the transistors $Q_3$ through $Q_6$ forming the pair of differential amplifiers are controlled by a voltage Vc, so that the collector current of one of the transistors $Q_3$ and $Q_4$ is increased as the collector current of the other is decreased, and so that the collector current of one of the transistors $Q_5$ and $Q_6$ is increased while that of the other is decreased.

That is, the currents in the load resistors $R_1$ and $R_2$ are controlled, and the output voltages are also controlled by the bias voltage.

Let us consider the operation when the transistors $Q_4$ and $Q_5$ are conductive (on), i.e. where the attenuation factor of the attenuator is 0 dB. The distortion and noise characteristics are determined by the transistors $Q_1$ and $Q_2$, the load resistors $R_1$ and $R_2$ are emitter resistors $R_3$ and $R_4$ only. That is, the distortion characteristic is determined by the steady voltage $V_R$ applied to the emitter resistors $R_3$ and $R_4$ and the ratio of the $V_{BE}$ characteristics KT/q of the transistors $Q_1$ and $Q_2$. The noise characteristic is governed by the square by the square average value of the terminal noises $Vn = \sqrt{4KTBR}$ of the load resistors $R_1$ and $R_2$ and the emitter resistors $R_3$ and $R_4$.

Accordingly, a level which meets both distortion and noise characteristics cannot be obtained without increasing the current value of the constant current source I. However, increasing the current of the constant current source I is disadvantageous in that the transistors must be increased in size.

SUMMARY OF THE INVENTION

In view of the foregoing, an object of this invention is to provide a voltage-controlled attenuator in which the above-described difficulty is eliminated.

DETAILED DESCRIPTION OF THE PREFERRED EMBODIMENTS

Figure 2:
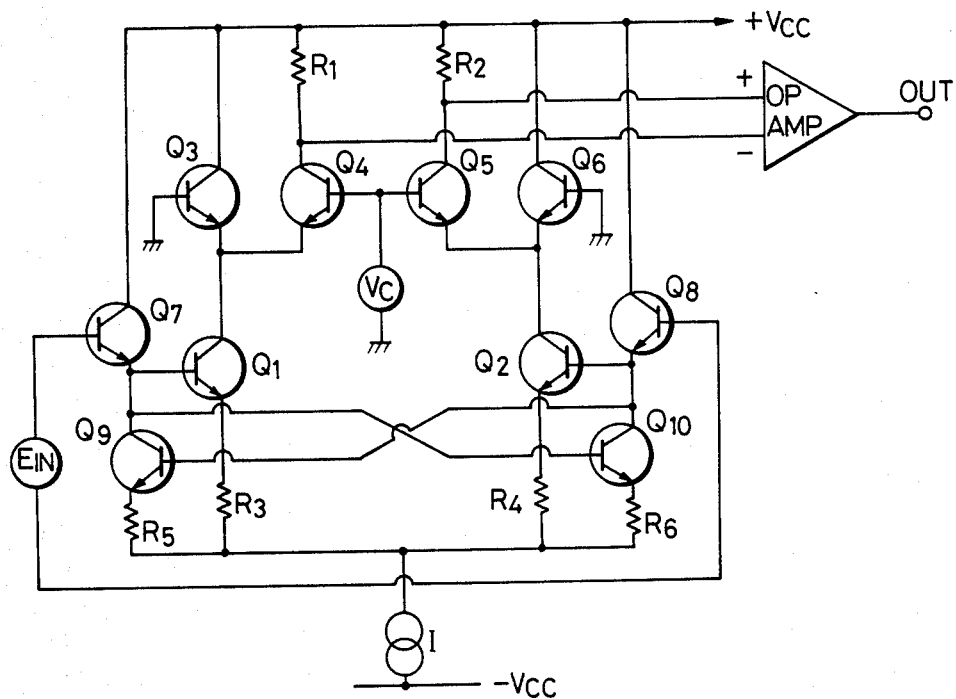
FIG. 2 is a circuit diagram of a first example of a voltage-controlled attenuator according to the invention.

FIG. 2 is a circuit diagram illustrating a first embodiment of the invention.

Figure 1:
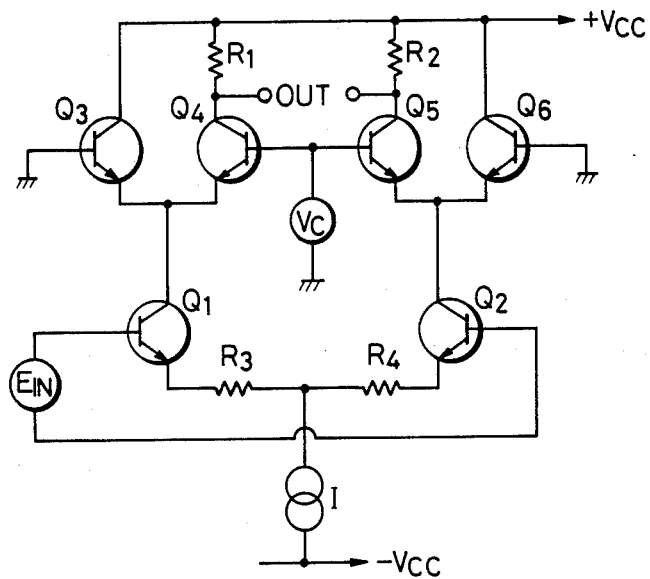
FIG. 1 is a circuit diagram of a conventional voltage-controlled attenuator.

In FIG. 2, a pair of differential amplifiers comprising transistors $Q_3$ through $Q_6$ are similar to those shown in FIG. 1, and are driven by a differential amplifier comprising transistors $Q_1$, $Q_2$ and $Q_7$ through $Q_{10}$.

That is, emitter followers comprising transistors $Q_7$ and $Q_8$ are connected to the input terminals of the transistors $Q_1$ and $Q_2$ forming the differential amplifier, respectively. The transistor $Q_9$ is connected so that the operating currents of the transistors $Q_7$ and $Q_2$ are coupled in a current mirror mode, and the transistor $Q_{10}$ is connected so that the operating currents of the transistors $Q_1$ and $Q_8$ are coupled in a current mirror mode.

On the other hand, the collector outputs of the transistors $Q_4$ and $Q_5$ are applied to an operational amplifier $OP_1$, so that the difference between these collector outputs is provided at the output terminal OUT of the operational amplifier $OP_1$.

In the voltage-controlled attenuator thus organized, the input voltage $E_{in}$ can be represented by the following expression (1):

$$E_{in} = -V_{BE7} - V_{BE1} + 2(R_E I_e) + V_{BE2} + V_{BE8} \quad (1)$$

where $R_E = r_3 = r_4$, resistances of the emitter resistors $R_3$ and $R_4$ being $r_3$ and $r_4$, respectively; and $I_e = I_{e1} = I_{e2}$, the emitter currents of the transistors $Q_1$ and $Q_2$ being $I_{e1}$ and $I_{e2}$, respectively.

When only the AC variation components are taken into consideration, then expression (1) can be rewritten as follows:

$$ei = -\Delta V_{BE7} - \Delta V_{BE1} + 2(R_E \cdot i_e) + \Delta V_{BE2} + \Delta V_{BE8} \quad (2)$$

where $\Delta V_{BE7} = \Delta V_{BE2}$ and $\Delta V_{BE8} = \Delta V_{BE1}$, because the operating currents of the transistors $Q_2$ and $Q_7$ are coupled in current mirror fashion through the transistor $Q_9$, and the operating currents of the transistors $Q_1$ through $Q_8$ are coupled in current mirror fashion through the transistor $Q_{10}$.

Therefore, expression (2) can be rewritten as follows:

$$E_{in} = 2R_E \cdot i_e$$

Thus, the $V_{BE}$ characteristics of the transistors are cancelled out, and the collector currents of the differential amplifier comprising the transistors $Q_1$ and $Q_2$, which is adapted to drive the pair of differential amplifiers having the transistors $Q_3$ through $Q_6$ are linearized.

Accordingly, even when the resistances of the emitter resistors $R_3$ and $R_4$ of the transistors $Q_1$ and $Q_2$ and those of the emitter resistors $R_5$ and $R_6$ of the transistors $Q_9$ and $Q_{10}$ are decreased and the current of the constant current source I is reduced, no distortion is produced, and the noise is low.

Thus, the pair of differential amplifiers comprising the transistors $Q_3$ through $Q_6$ are driven by the collector currents of the transistors $Q_1$ and $Q_2$, which are made distortion-less. Therefore, voltages developed across the load resistors $R_1$ and $R_2$ suffer mainly from secondary distortions.

However, since the outputs of the pair of differential amplifiers are subjected to subtraction in the operational amplifier $OP_1$, the secondary distortions are cancelled out; that is, no distortion is provided at the output of the operational amplifier $OP_1$. Thus, the voltage-controlled attenuator is, as a whole, low in noise and distortion.

Figure 3:
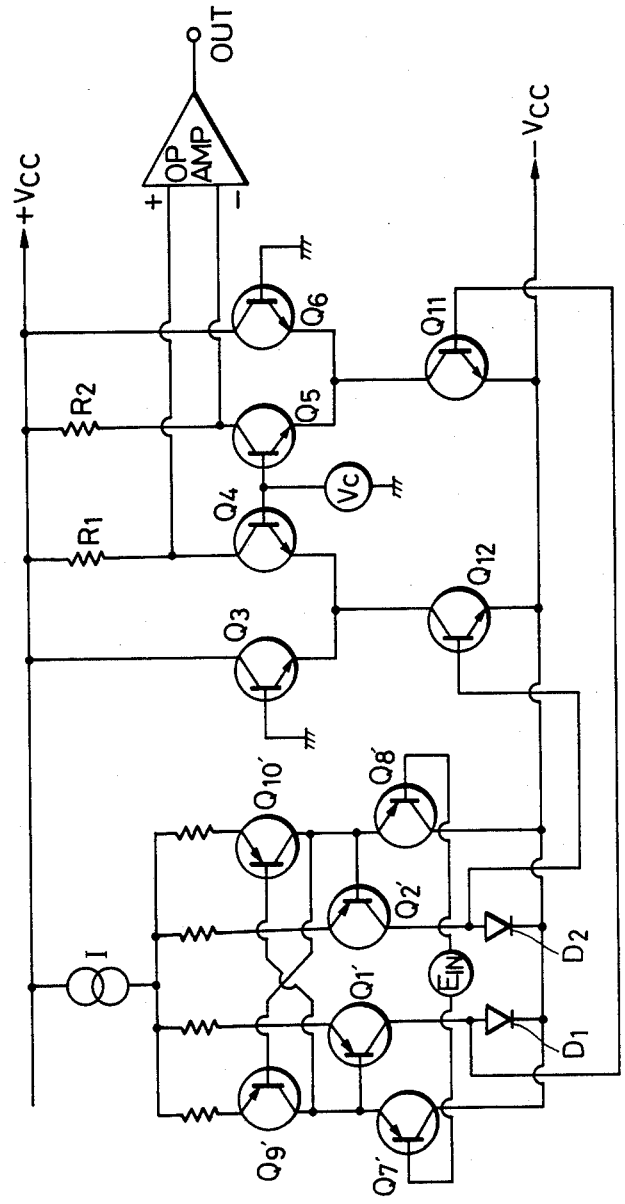
FIG. 3 is a circuit diagram of a second example of the voltage-controlled attenuator according to the invention.

FIG. 3 is a circuit diagram illustrating another embodiment of the invention.

In this embodiment, a pair of differential amplifiers, which are made up of transistors $Q_3$ and $Q_4$ and transistors $Q_5$ and $Q_6$, respectively, are driven by transistors $Q_{11}$ and $Q_{12}$, respectively. A linearized difference amplifier comprising transistors $Q_1'$, $Q_2'$, $Q_7'$, $Q_8'$, $Q_9'$ and $Q_{10}'$ constructed similarly to that in the embodiment of FIG. 2, employs PNP transistors. The transistors $Q_1'$, $Q_2'$, $Q_7'$, $Q_8'$, $Q_9'$ and $Q_{10}'$ correspond to the transistors $Q_1$, $Q_2$, $Q_7$, $Q_8$, $Q_9$ and $Q_{10}$ in FIG. 2, respectively. The transistor $Q_{11}$ is driven by the output of the transistor $Q_1'$, and the transistor $Q_{12}$ is driven by the output of the transistor $Q_2'$.

In the embodiment of FIG. 3, the transistors $Q_7'$ and $Q_8'$ form emitter followers connected to the input terminals of the transistors $Q_1'$ and $Q_2'$, respectively. The operating currents of the transistors $Q_2'$ and $Q_7'$ are coupled in the current mirror mode through the transistor $Q_9'$. Similarly, the operating currents of the transistors $Q_1'$ and $Q_8'$ are coupled in the current mirror mode through the transistor $Q_{10}'$. Transistors $Q_{11}$ and $Q_{12}$, in combination with diodes $D_1$ and $D_2$, form current mirror circuits, respectively.

The effect of the second embodiment of FIG. 3 is similar to that of the first embodiment of FIG. 2, and therefore a detailed description thereof will be omitted.

However, it should be noted that the power utilization rate is improved, because the transistors $Q_1'$, $Q_2'$, $Q_7'$, $Q_8'$, $Q_9'$ and $Q_{10}'$ forming the differential amplifier are PNP transistors.

As is apparent from the above description, the voltage-controlled attenuator of the invention has less distortion and noise, and can be operated with a small current. As the attenuator can be operated with a small current, it can easily be provided in the form of an integrated circuit. Furthermore, the voltage-controlled attenuator can be operated with a low voltage, because the voltage loss due to the emitter resistors is small.

What is claimed is:

1. A voltage-controlled attenuator comprising:
   a pair of differential amplifiers for generating a pair of output signals for attenuation gain control, each of said differential amplifiers comprising a pair of first and second transistors having commonly connected emitters; and a driver differential amplifier comprising a third pair of transistors wherein each transistor in said third pair has its respective collector connected to one of the commonly connected emitters of one of said first and second pairs of transistors in said pair of differential amplifiers for driving said pair of differential amplifiers, first and second emitter followers respectively connected to first and second input terminals of said driver differential amplifier; and first and second control transistors connecting said respective emitter followers to transistors of said driver differential amplifier in a current mirror mode such that the operating current of said first emitter follower and the operating current of a first transistor of said third pair of transistors in said driver differential amplifier and the operating current of said second emitter follower and the operating current a second transistor of said third pair of transistors in said driver differential amplifier are proportional, and
   an operational amplifier, said output signals from said pair of differential amplifiers being applied to said operational amplifier for subtraction, an output of said operational amplifier being substantially distortion free.

2. A voltage controlled attenuator as claimed in claim 1, said first input terminal being coupled to a first control transistor of said driver differential amplifier and said second input terminal being coupled to said second control transistor of said driver differential amplifier, said first emitter follower being connected to said second transistor of said driver differential amplifier in a current mirror mode, by said first control transistor and said second emitter follower being connected to said first transistor of said driver differential amplifier in a current mirror mode, by said second control transistor.

3. A voltage-controlled attenuator as claimed in claim 1, said first and second emitter followers comprising PNP transistors, said differential amplifier being connected to said pair of differential amplifiers by way of a pair of intermediate transistors, each interposed between the collectors of one of said first and second transistors of said driver differential amplifier and one of said commonly connected emitters of said pair of differential amplifiers, driven by outputs of said differential amplifier.

4. A voltage-controlled attenuator as claimed in claim 3, further including a pair of diodes, each connected across the base-emitter junction of one of said pair of intermediate transistors, which in combination with said intermediate transistors, comprise current mirror circuits.

* * * * *